US012506487B2

(12) United States Patent
Lin et al.

(10) Patent No.: US 12,506,487 B2
(45) Date of Patent: Dec. 23, 2025

(54) COMPENSATION CIRCUIT AND COMPENSATION METHOD FOR SUCCESSIVE-APPROXIMATION REGISTER (SAR) ANALOG-TO-DIGITAL CONVERTER (ADC)

(71) Applicant: REALTEK SEMICONDUCTOR CORPORATION, Hsinchu (TW)

(72) Inventors: Jian-Ru Lin, Hsinchu (TW); Ying-Cheng Wu, Hsinchu (TW); Chia-Wei Yu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 127 days.

(21) Appl. No.: 18/661,769

(22) Filed: May 13, 2024

(65) Prior Publication Data

US 2024/0388302 A1 Nov. 21, 2024

Related U.S. Application Data

(60) Provisional application No. 63/467,413, filed on May 18, 2023.

(30) Foreign Application Priority Data

Nov. 22, 2023 (TW) ................... 112145222

(51) Int. Cl.
*H03M 1/06* (2006.01)
(52) U.S. Cl.
CPC .................. *H03M 1/0604* (2013.01)
(58) Field of Classification Search
CPC ................................... H03M 1/0604

USPC ........................................... 341/118
See application file for complete search history.

(56) References Cited

U.S. PATENT DOCUMENTS

| | | | |
|---|---|---|---|
| 6,600,437 B1* | 7/2003 | Confalonieri | H03M 1/68 327/554 |
| 9,172,388 B1* | 10/2015 | Stein | H03M 1/121 |
| 10,348,319 B1* | 7/2019 | Monangi | H03M 1/08 |
| 10,693,487 B1* | 6/2020 | Lei | H03M 1/468 |
| 10,862,497 B1* | 12/2020 | Lin | H03M 1/1245 |
| 11,012,084 B1* | 5/2021 | Abu Hilal | H03M 1/468 |
| 2010/0079318 A1* | 4/2010 | Berens | H03M 1/002 341/120 |
| 2014/0247170 A1* | 9/2014 | Nagarajan | G06F 1/3296 341/155 |
| 2015/0077280 A1* | 3/2015 | Park | H03M 1/38 341/156 |

(Continued)

*Primary Examiner* — Jean B Jeanglaude
(74) *Attorney, Agent, or Firm* — WPAT, PC

(57) ABSTRACT

A compensation circuit is applied to a successive-approximation register (SAR) analog-to-digital converter (ADC) (SAR ADC) that includes a comparator, and the comparator includes a first transistor and a second transistor. The first transistor and the second transistor receive an input signal during a sampling phase, and the comparator determines at least one bit of a digital output code during a comparison phase. The compensation circuit includes a voltage generator coupled to the comparator for providing a first voltage to a first bulk of the first transistor and a second bulk of the second transistor during the sampling phase and providing a second voltage to the first bulk of the first transistor and the second bulk of the second transistor during the comparison phase.

18 Claims, 19 Drawing Sheets

(56) References Cited

U.S. PATENT DOCUMENTS

2020/0007143 A1\* 1/2020 Farid .................... H03M 1/468
2020/0195269 A1\* 6/2020 Lei ....................... H03M 1/468
2020/0220553 A1\* 7/2020 Zabroda ............... H03M 1/462
2022/0190840 A1\* 6/2022 Moon ................... H03M 1/462

\* cited by examiner

|  | Vb=0 | Vb=0.3 | Vb=0.6 | Vb=0.9 |
|---|---|---|---|---|
| maximum error amount | 1.71E-13 | 1.46E-13 | 1.20E-13 | 1.55E-13 |
| minimum error amount | 4.89E-15 | 0.00E+00 | 0.00E+00 | 0.00E+00 |
| error amount (%) |  | -14.66 | -29.66 | -9.53 |

FIG. 7

COMPENSATION CIRCUIT AND COMPENSATION METHOD FOR SUCCESSIVE-APPROXIMATION REGISTER (SAR) ANALOG-TO-DIGITAL CONVERTER (ADC)

BACKGROUND OF THE INVENTION

1. Field of the Invention

The present invention generally relates to amplifiers, and, more particularly, to linearity compensation circuits for amplifiers.

2. Description of Related Art

Reference is made to FIG. 1, which shows a circuit 100. The circuit 100 can be used as a conventional comparator or a pre-amplifier of the conventional comparator. The circuit 100 includes transistors M1, M2, M3, M4, and M5. The gate of the transistor M1 receives an input signal VIN, and the gate of the transistor M2 receives an input signal VIP. The gate of the transistor M3, the gate of the transistor M4, and the gate of the transistor M5 all receive a clock CLK_cmp. The drain of the transistor M1 outputs an output signal VOP, and the drain of the transistor M2 outputs an output signal VON. The input signal VIP and the input signal VIN may be a differential signal pair, and the output signal VOP and the output signal VON may be another differential signal pair. As the operating principles of the circuit 100 are well known to people having ordinary skill in the art, the details are omitted for brevity.

The disadvantage of the circuit 100 is that the transistors M1 and M2 have parasitic capacitances, and capacitance values of the parasitic capacitances are a function of the input signal (VIP or VIN). The parasitic capacitance may have a negative impact (e.g., reduced linearity) on other circuits (e.g., sample and hold circuits) coupled to the circuit 100, thereby causing performance degradation or even errors in components using or containing the circuit 100.

SUMMARY OF THE INVENTION

In view of the issues of the prior art, an object of the present invention is to provide a compensation circuit and a compensation method, so as to make an improvement to the prior art.

According to one aspect of the present invention, a compensation circuit is provided. The compensation circuit is applied to a successive-approximation register (SAR) analog-to-digital converter (ADC). The SAR ADC includes a comparator, and the comparator includes a first transistor and a second transistor. Both the first and second transistors receive an input signal during a sampling phase, and the comparator determines at least one bit of a digital output code during a comparison phase. The compensation circuit includes a voltage generator coupled to the comparator. The voltage generator provides a first voltage to a first bulk of the first transistor and a second bulk of the second transistor during the sampling phase, and a second voltage to the first bulk of the first transistor and the second bulk of the second transistor during the comparison phase.

According to another aspect of the present invention, a compensation method is provided. The compensation method is applied to a SAR ADC. The SAR ADC includes a comparator, and the comparator includes a first transistor and a second transistor. Both the first and second transistors receive an input signal during a sampling phase, and the comparator determines at least one bit of a digital output code during a comparison phase. The compensation method includes the following steps: providing a first voltage to a first bulk of the first transistor and a second bulk of the second transistor during the sampling phase; and providing a second voltage to the first bulk of the first transistor and the second bulk of the second transistor during the comparison phase.

According to still another aspect of the present invention, a compensation circuit is provided. The compensation circuit is applied to a SAR ADC. The SAR ADC includes a comparator, and the comparator includes a first, second, third, fourth, and fifth transistor. The first drain of the first transistor is electrically connected to the third drain of the third transistor, and the second drain of the second transistor is electrically connected to the fourth drain of the fourth transistor. Both the first and second transistors receive an input signal during a sampling phase, and the comparator determines at least one bit of a digital output code during a comparison phase. The compensation circuit includes a first switch and a second switch. The first switch is coupled to a first node, which is either the first bulk of the first transistor, the third source of the third transistor, or the first source of the first transistor. The second switch is coupled to a second node, which is either the second bulk of the second transistor, the fourth source of the fourth transistor, or the second source of the second transistor. During the sampling phase, the first and second switches couple the first and second nodes to the input signal. During the comparison phase, the first and second switches couple the first and second nodes to a reference voltage or the fifth drain of the fifth transistor.

According to still another aspect of the present invention, a compensation method is provided. The compensation method is applied to a SAR ADC. The SAR ADC includes a comparator, and the comparator includes a first, second, third, fourth, and fifth transistor. The first drain of the first transistor is electrically connected to the third drain of the third transistor, and the second drain of the second transistor is electrically connected to the fourth drain of the fourth transistor. Both the first and second transistors receive an input signal during a sampling phase, and the comparator determines at least one bit of a digital output code during a comparison phase. The compensation method includes the following steps: (A) coupling a first node and a second node to the input signal during the sampling phase; and (B) coupling the first and second nodes to a reference voltage or the fifth drain of the fifth transistor during the comparison phase. The first node is either the first bulk of the first transistor, the third source of the third transistor, or the first source of the first transistor, and the second node is either the second bulk of the second transistor, the fourth source of the fourth transistor, or the second source of the second transistor.

The technical means embodied in the embodiments of the present invention can solve at least one of the problems of the prior art. Therefore, compared to the prior art, the present invention can improve the linearity of components.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 7 shows the maximum error amount, the minimum error amount, and the error amount percentage corresponding to the charge amount difference in FIG. 6.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a compensation circuit and a compensation method. On account of that some or all elements of the compensation circuit could be known, the detail of such elements is omitted provided that such detail has little to do with the features of this disclosure, and that this omission nowhere dissatisfies the specification and enablement requirements. Some or all of the processes of the compensation method may be implemented by software and/or firmware and can be performed by the compensation circuit or its equivalent. A person having ordinary skill in the art can choose components or steps equivalent to those described in this specification to carry out the present invention, which means that the scope of this invention is not limited to the embodiments in the specification.

Figure 1:
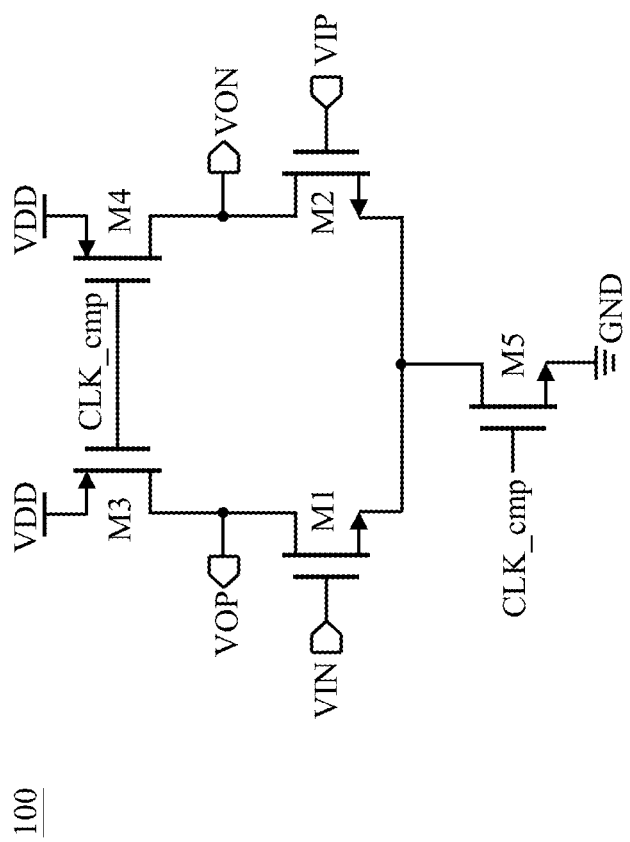
FIG. 1 shows a conventional circuit.
Figure 2:
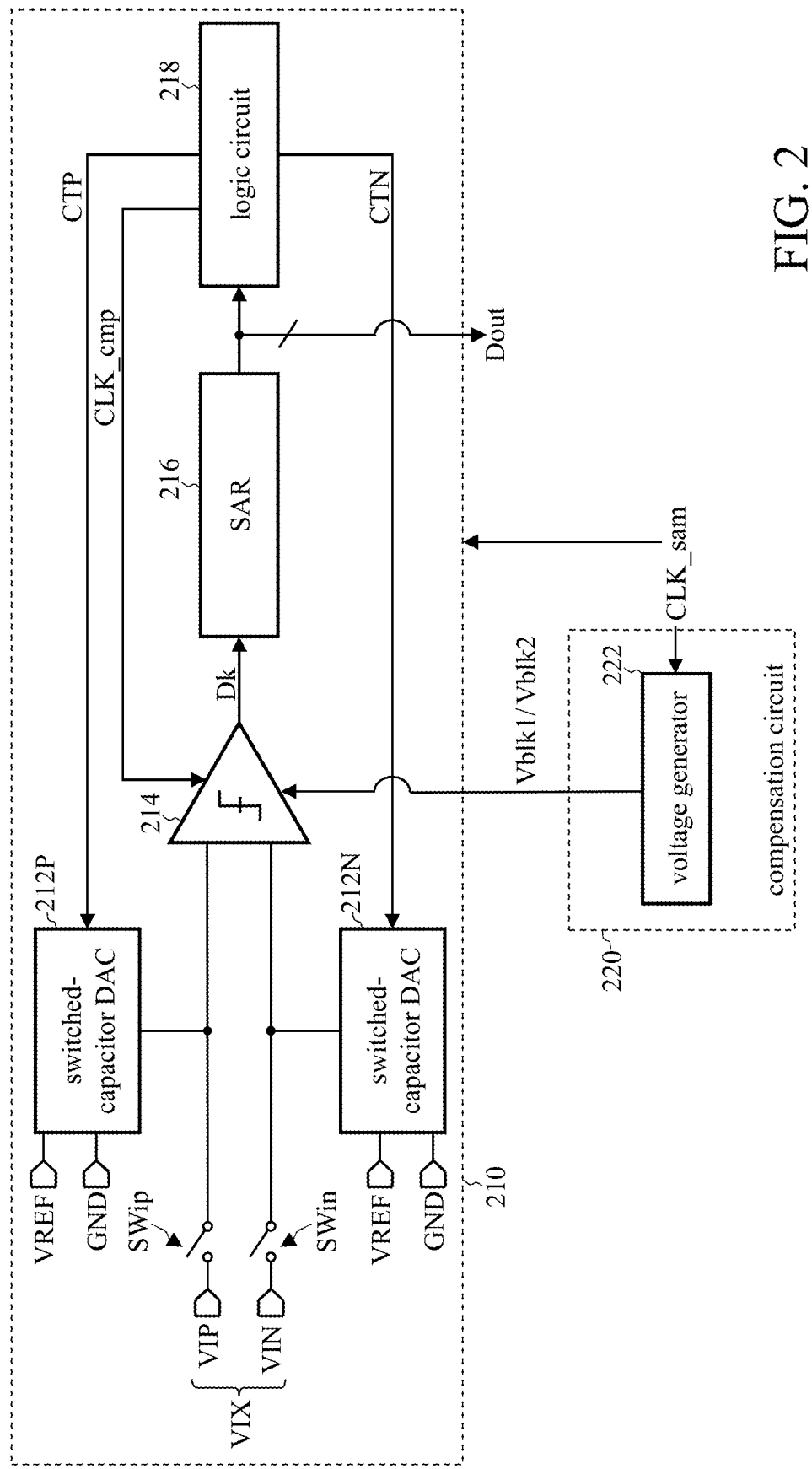
FIG. 2 shows a functional block diagram of a successive-approximation register (SAR) analog-to-digital converter (ADC) and a compensation circuit according to an embodiment of the present invention.

FIG. 2 shows a functional block diagram of a successive-approximation register (SAR) analog-to-digital converter (ADC) and a compensation circuit according to an embodiment of the present invention. The SAR ADC 210 includes a switched-capacitor digital-to-analog converter (DAC) 212P, a switched-capacitor DAC 212N, a comparator 214, a successive-approximation register (SAR) 216, and a logic circuit 218.

The switched-capacitor DAC 212P and the switched-capacitor DAC 212N each include a plurality of capacitors and a plurality of internal switches. One terminal of each capacitor is coupled or electrically connected to the comparator 214 and receives the input signal VIP (or the input signal VIN) through the sampling switch SWip (or the sampling switch SWin). The other terminal of each capacitor is coupled to (receives) a reference voltage GND (e.g., a ground level) or a reference voltage VREF (e.g., a voltage higher than the ground level) through an internal switch. The input signal VIX (also referred to as an input signal pair VIX) includes the input signal VIP and the input signal VIN. The input signal VIP and the input signal VIN may be a differential signal pair, or one of the input signal VIP and the input signal VIN may be a fixed voltage. The internal switches of the switched-capacitor DAC 212P are controlled by the control signal CTP, while the internal switches of the switched-capacitor DAC 212N are controlled by the control signal CTN.

The logic circuit 218 generates the control signal CTP, the control signal CTN, and the clock CLK_cmp according to the sampling clock CLK_sam. The comparator 214 operates according to the clock CLK_cmp.

The compensation circuit 220 is used to compensate for the nonlinearity of the comparator 214 to improve the overall linearity of the SAR ADC 210 (including but not limited to improving the total harmonic distortion (THD), the integral nonlinearity (INL), and the differential nonlinearity (DNL) of the SAR ADC 210). The compensation circuit 220 includes a voltage generator 222. The voltage generator 222 generates or outputs a voltage Vblk1 or a voltage Vblk2 according to the sampling clock CLK_sam. The voltage Vblk1 and the voltage Vblk2 are respectively used to bias the comparator 214 during the sampling phase Φs and the comparison phase Φc of the SAR ADC 210.

Figure 3A:
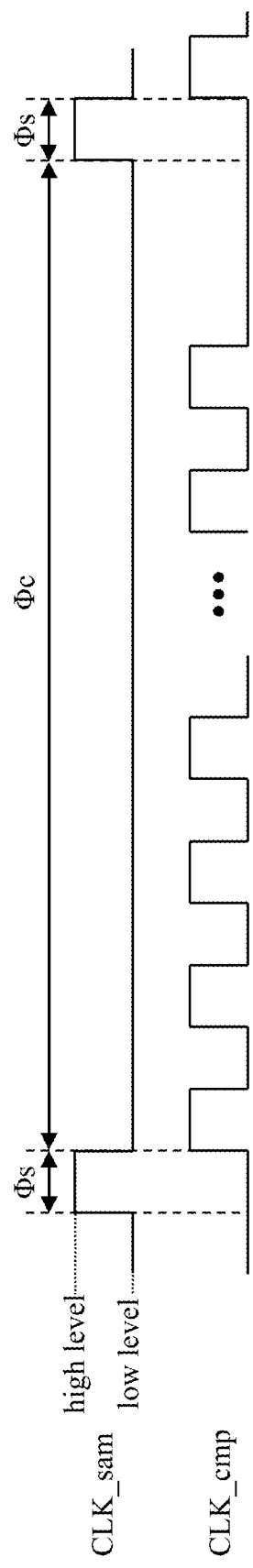
FIG. 3A is a waveform of the operating clock of the SAR ADC 210 in FIG. 2.

Reference is made to FIG. 3A, which is a waveform of an operating clock of the SAR ADC 210. The sampling phase Φs and the comparison phase Φc respectively correspond to a high level and a low level of the sampling clock CLK_sam.

During the sampling phase Φs, the sampling switch SWip and the sampling switch SWin are turned on, the switched-capacitor DAC 212P and the switched-capacitor DAC 212N respectively sample the input signal VIP and the input signal VIN, and the input terminals of the comparator 214 receive the input signal VIP and input signal VIN.

During the comparison phase Pc, the sampling switch SWip and the sampling switch SWin are turned off, and the comparator 214 compares the terminal voltage of the switched-capacitor DAC 212P and the terminal voltage of the switched-capacitor DAC 212N according to the clock CLK_cmp and generates a comparison result Dk. The comparison result Dk is stored in the SAR 216 and becomes one of the bits of the digital output code Dout. The logic circuit 218 uses the control signal CTP and the control signal CTN to respectively control the internal switches of the switched-capacitor DAC 212P and the switched-capacitor DAC 212N according to the current digital output code Dout (to cause the charges on the capacitors to redistribute, thereby changing the terminal voltages). Then, the comparator 214 performs the next comparison according to the clock CLK_cmp to determine the next bit of the digital output code Dout. By repeating the above steps, the value of the digital output code Dout gradually approaches the magnitude of the input signal. When the comparison phase Pc ends, the digital output code Dout is determined. As the operating principles of the SAR ADC are well known to people having ordinary skill in the art, the details are omitted for brevity.

Figure 3B:
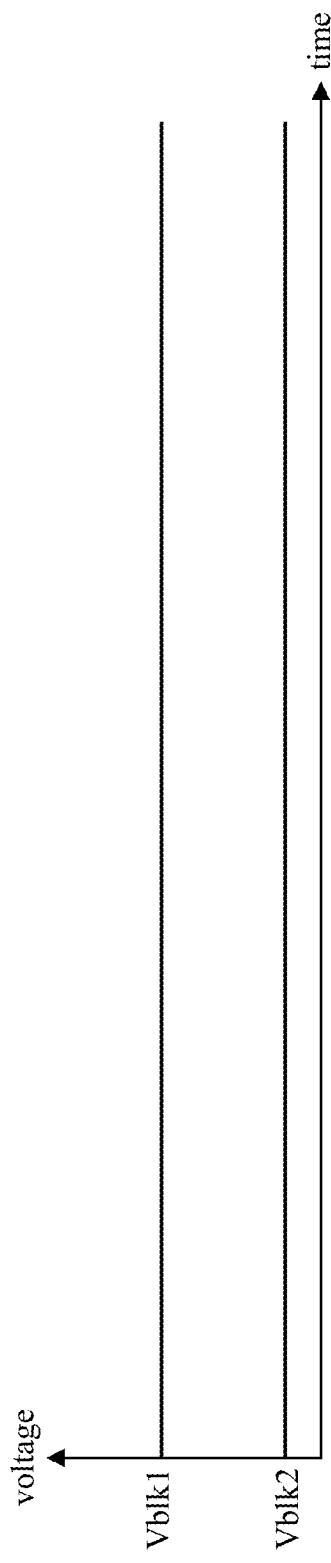
FIG. 3B shows a schematic diagram of a voltage Vblk1 and a voltage Vblk2 according to an embodiment.

During the sampling phase Φs, the voltage generator 222 generates or outputs the voltage Vblk1. During the comparison phase Φc, the voltage generator 222 generates or outputs the voltage Vblk2. Reference is made to FIG. 3B, which shows a schematic diagram of the voltage Vblk1 and the voltage Vblk2 according to an embodiment. The voltage Vblk1 and the voltage Vblk2 are both constant voltages, and the voltage Vblk1 is greater than the voltage Vblk2. It should be noted that the voltage Vblk1 and the voltage Vblk2 can also be regarded as two levels of a voltage signal.

Figure 4:
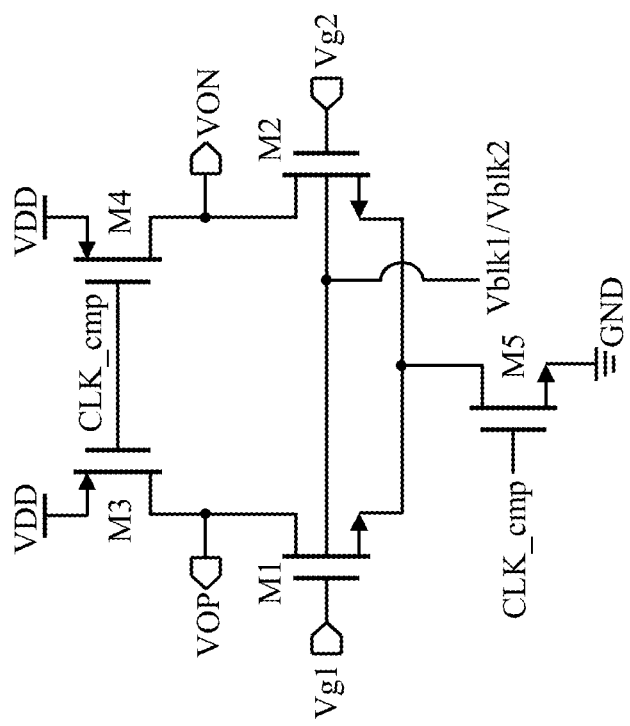
FIG. 4 is a circuit diagram of a comparator according to an embodiment of the present invention.

Reference is made to FIG. 4, which is a circuit diagram of the comparator according to an embodiment of the present invention. The drain of the transistor M1 is coupled or electrically connected to the drain of the transistor M3, and the drain of the transistor M2 is coupled or electrically connected to the drain of the transistor M4. The gate of the transistor M1 and the gate of the transistor M2 are input terminals of the comparator 214. The voltage generator 222 is coupled or electrically connected to the bulk of the transistor M1 and the bulk of the transistor M2 to provide the voltage Vblk1 or the voltage Vblk2 to the bulk of the transistor M1 and the bulk of the transistor M2.

More specifically, during the sampling phase Φs, the gate voltage Vg1 of the transistor M1 is equal to the input signal VIN, the gate voltage Vg2 of the transistor M2 is equal to the input signal VIP, and the voltage generator 222 outputs the voltage Vblk1 to bias the bulk of the transistor M1 and the bulk of the transistor M2 at the voltage Vblk1. During the comparison phase Φc, the gate voltage Vg1 of the transistor M1 is equal to the terminal voltage of the switched-capacitor DAC 212N, the gate voltage Vg2 of the transistor M2 is equal to the terminal voltage of the switched-capacitor DAC 212P, and the voltage generator 222 outputs the voltage Vblk2 to bias the bulk of the transistor M1 and the bulk of the transistor M2 at the voltage Vblk2.

Reference is made to FIG. 4, the parasitic capacitance of the transistor M1 or the transistor M2 can be expressed by equation (1).

$$Cc = Cgb(Vi) + Cgd(Vi) + Cgs(Vi) \quad (1)$$

where Cgb(Vi) is the parasitic capacitance between the gate and the bulk, Cgd(Vi) is the parasitic capacitance between the gate and the drain, and Cgs(Vi) is the parasitic capacitance between the gate and the source. Cgb(Vi), Cgd(Vi) and Cgs(Vi) are all functions of the input signal Vi (VIP or VIN).

Figure 5:
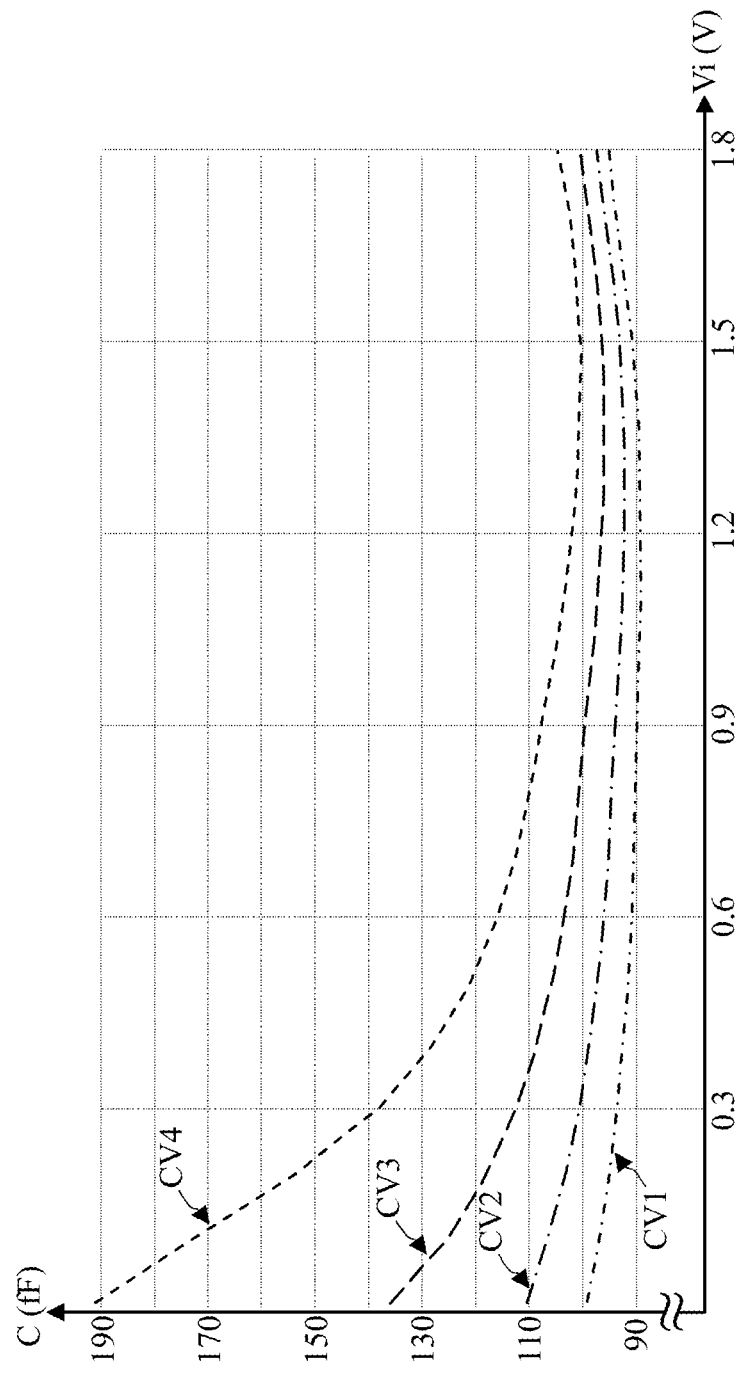
FIG. 5 is a diagram showing the relationship between the parasitic capacitance of the comparator and the input signal.

Reference is made to FIG. 5, which is a diagram showing the relationship between the parasitic capacitance of the comparator and the input signal with respect to multiple bulk voltages Vb. It should be noted that FIG. 5 only considers Cgb(Vi) and does not take Cgd(Vi) and Cgs(Vi) into account. The curve CV1, the curve CV2, the curve CV3, and the curve CV4 respectively correspond to the bulk voltage Vb being 0 V, 0.3 V, 0.6 V, and 0.9 V. It can be observed from FIG. 5 that when the input signal Vi is extremely small (0 V) or extremely large (1.8 V), the parasitic capacitance is relatively large. In other words, the rail-to-rail input signal Vi has a dramatic impact on the linearity of the comparator. Taking the curve CV1 (corresponding to the bulk voltage Vb being 0 V) as an example, in the range from Vi=0 V to Vi=1.8 V, the variation of the parasitic capacitance of the comparator is about 10 (=99−89) fF. For a 12-bit SAR ADC 210 whose switched-capacitor DAC 212P (or switched-capacitor DAC 212N) has an equivalent capacitance of 2 pF, this variation results in an influence of approximately 20 (=10/2000*4095) LSBs, greatly reducing the linearity of the SAR ADC 210.

Figure 6:
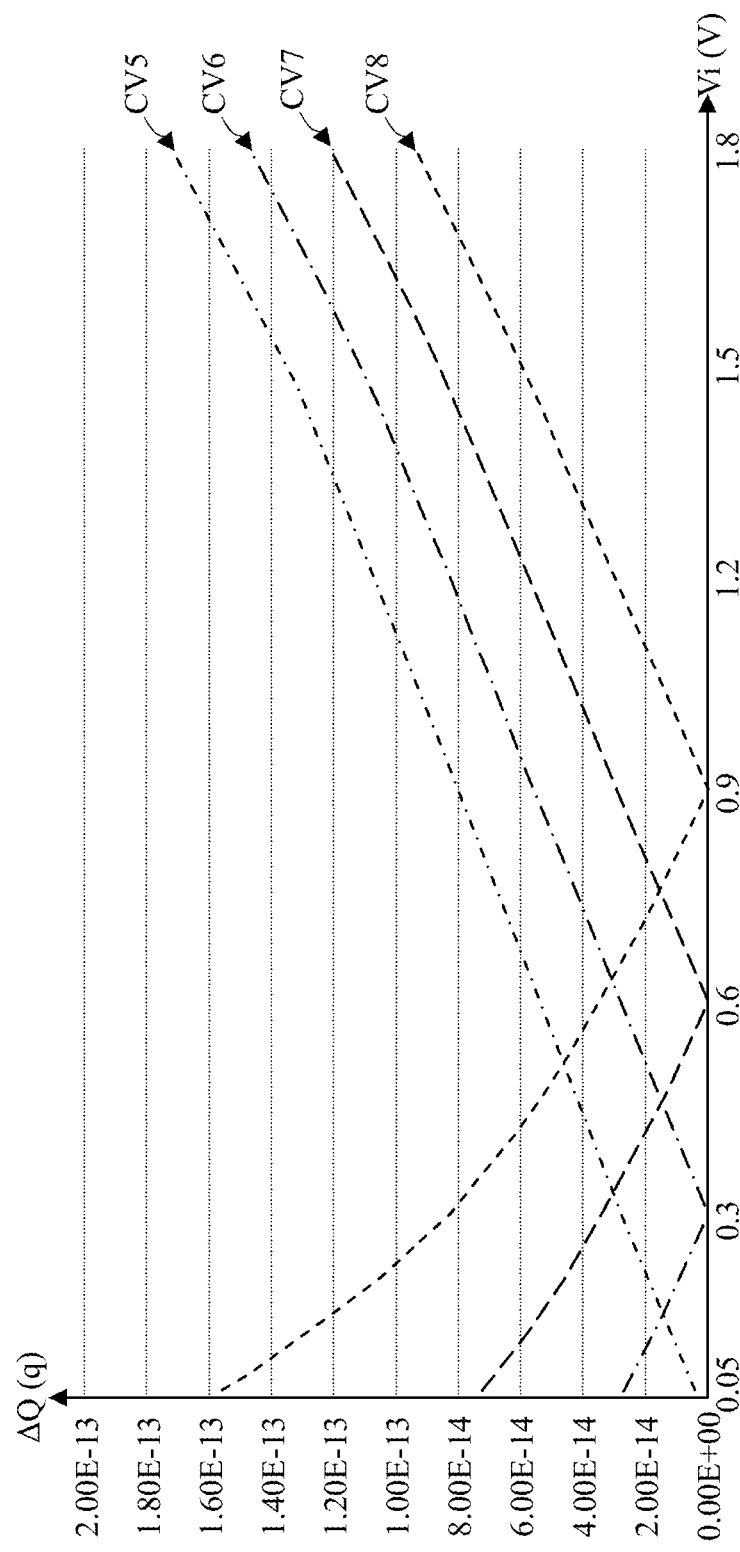
FIG. 6 is a diagram showing the relationship between the difference in the amount of charges sampled by a SAR ADC and the input signal.

Reference is made to FIG. 6, which is a diagram showing the relationship between the difference in the amount of charges sampled by the SAR ADC and the input signal with respect to multiple bulk voltages Vb. Similarly, FIG. 6 only considers Cgb(Vi) and does not take Cgd(Vi) and Cgs(Vi) into account. The curve CV5, the curve CV6, the curve CV7, and the curve CV8 respectively correspond to the bulk voltage Vb being 0 V, 0.3 V, 0.6 V, and 0.9 V. The charge amount difference (ΔQ) is as shown in equation (2).

$$\Delta Q = |\text{Error}(Qr - Qi)| \quad (2)$$

where Qr is the amount of charges sampled by the actual SAR ADC 210 (the comparator 214 of which has parasitic capacitance(s)), and Qi is the amount of charges sampled by the ideal SAR ADC 210 (the comparator 214 of which has no parasitic capacitance). It can be observed from FIG. 6 that the curve CV6, the curve CV7, and the curve CV8 each have a turning point at the input signal Vi being 0.3 V, 0.6 V, and 0.9 V respectively. Because the voltage across the parasitic capacitor at the turning points is 0 V (i.e., Vi=Vb, so that the charge amount Qb on the parasitic capacitance Cgb(Vi) (where Qb=Cgb(Vi)×(Vi−Vb)=0) is zero), the charge amount difference ΔQ is zero.

Reference is made to FIG. 7, which shows the maximum error amount, the minimum error amount, and the error amount percentage (error amount (%)) relative to the bulk voltage Vb being 0 V corresponding to the charge amount difference shown in FIG. 6. Taking the bulk voltage Vb being 0.3 V as an example, the maximum error amount is 1.46E-13 (approximately corresponding to the input signal Vi being 1.8 V), the minimum error amount is 0.00E+00 (approximately corresponding to the input signal Vi being 0.3 V), and the error amount percentage is −14.66%. In other words, the overall error amount when the bulk voltage Vb is biased at 0.3 V is less than the overall error amount when the bulk voltage Vb is biased at 0 V by 14.66%. It can be observed from FIG. 7 that whether the bulk voltage Vb is biased at 0.3 V, 0.6 V, or 0.9 V, the charge amount difference ΔQ becomes smaller (compared to when there is no bias, i.e., when the bulk voltage Vb is 0 V), resulting in an improvement in the overall linearity of the SAR ADC 210.

Figure 8:
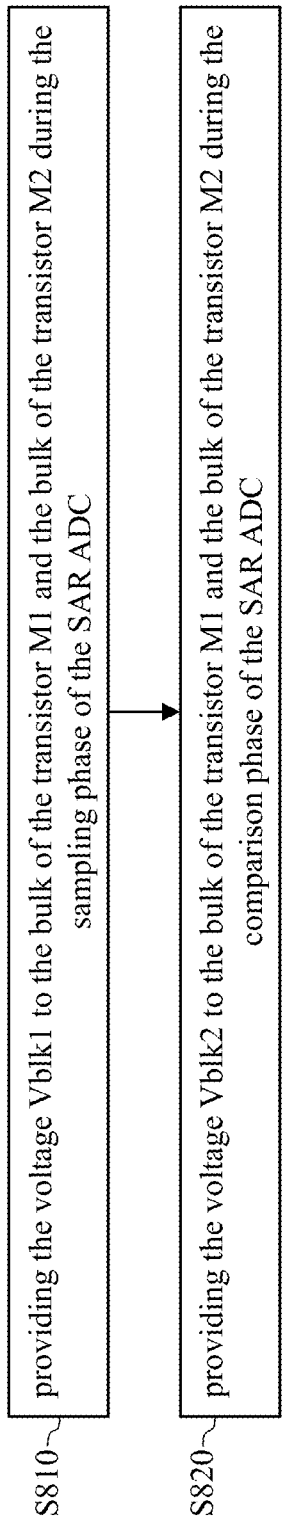
FIG. 8 is a flowchart of a compensation method according to an embodiment of the present invention.

Reference is made to FIG. 8, which is a flowchart of a compensation method according to an embodiment of the present invention. FIG. 8 corresponds to the embodiment of FIG. 2 and includes the following steps.

Step S810: The voltage generator 222 provides the voltage Vblk1 to the bulk of the transistor M1 and the bulk of the transistor M2 during the sampling phase Φs of the SAR ADC 210, reducing the parasitic capacitance(s) of the comparator 214 of the SAR ADC 210 (primarily the parasitic capacitance Cgb(Vi) between the gate and the bulk). As a result, the overall linearity of the SAR ADC 210 can be improved.

Step S820: The voltage generator 222 provides the voltage Vblk2 (e.g., the ground level) to the bulk of the transistor M1 and the bulk of the transistor M2 during the comparison phase Φc of the SAR ADC 210, allowing the comparator 214 to perform a comparison operation.

Figure 9:
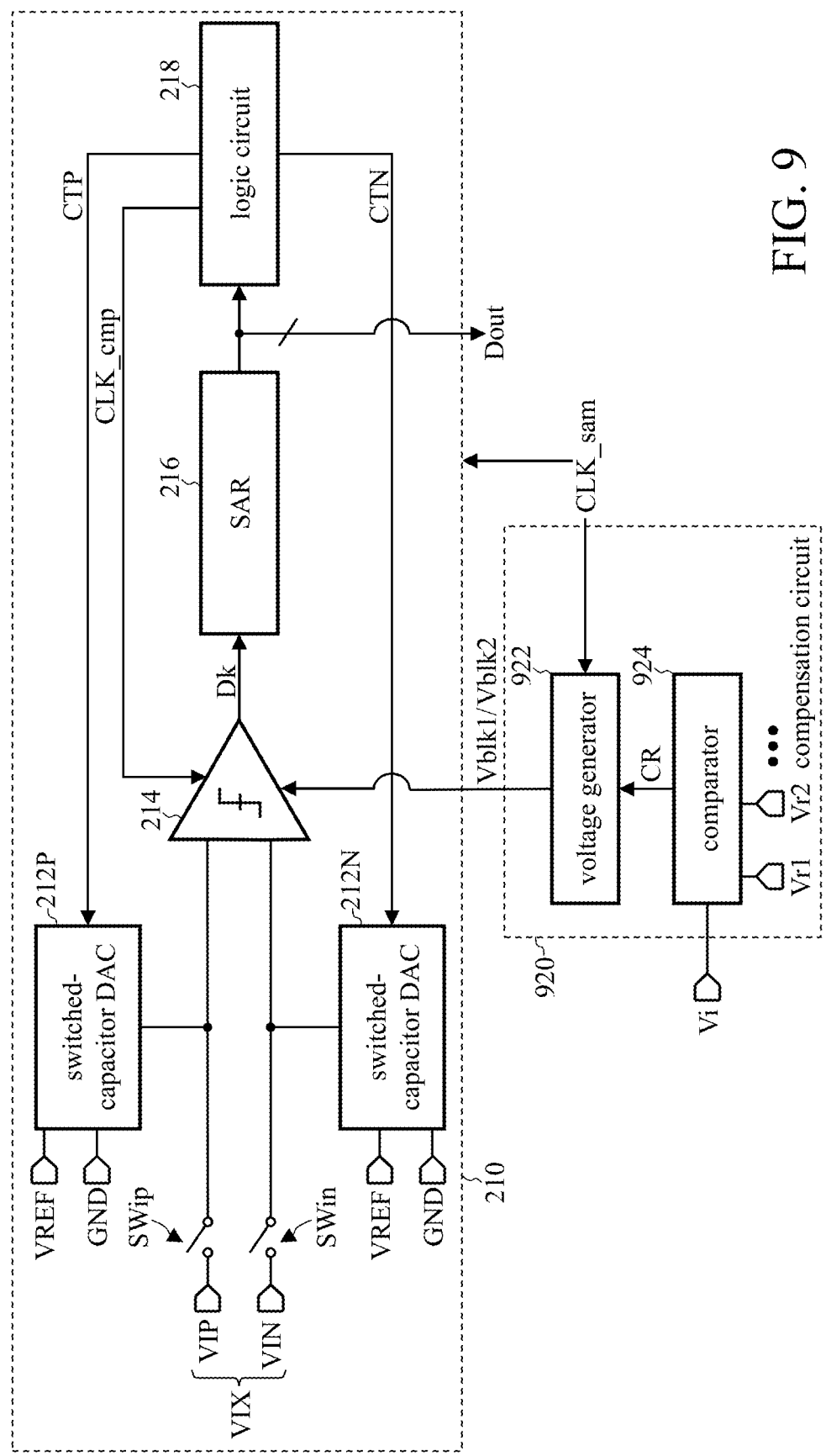
FIG. 9 shows a functional block diagram of a SAR ADC and a compensation circuit according to another embodiment of the present invention.

FIG. 9 shows a functional block diagram of a SAR ADC and a compensation circuit according to another embodiment of the present invention. The compensation circuit 920 includes a voltage generator 922 and a comparator 924 for providing the voltage Vblk1 or the voltage Vblk2 to the comparator 214. Similar to the voltage generator 222, the voltage generator 922 provides the voltage Vblk1 or the voltage Vblk2 to the transistor M1 and the transistor M2 of the comparator 214 according to the sampling clock CLK_sam (refer to FIG. 4), but the voltage generator 922 adjusts the voltage Vblk1 according to the comparison result CR generated by the comparator 924. The comparator 924 compares the input signal Vi (the input signal VIP or the input signal VIN) with a plurality of preset voltages (Vr1, Vr2, . . . ) to generate the comparison result CR.

More specifically, when the comparison result CR indicates that the input signal Vi is less than the preset voltage Vr1, the voltage generator 922 outputs the voltage Vblk1 of a first level. When the comparison result CR indicates that the input signal Vi is greater than or equal to the preset voltage Vr1 and less than the preset voltage Vr2, the voltage generator 922 outputs the voltage Vblk1 of a second level. Taking FIG. 6 as an example, the preset voltage Vr1 and the preset voltage Vr2 can be 0.45 V and 0.75 V respectively, and the first level and the second level can be 0.3 V and 0.6 V respectively. In other words, the compensation circuit 920 can adaptively (namely, according to the input signal Vi) bias the comparator 214 to achieve a better compensation effect. It should be noted that in the embodiment of FIG. 9, the voltage Vblk1 is not a constant value (rather, it is associated with the input signal Vi), but the voltage Vblk2 can be a constant value (e.g., the ground level).

Figure 10:
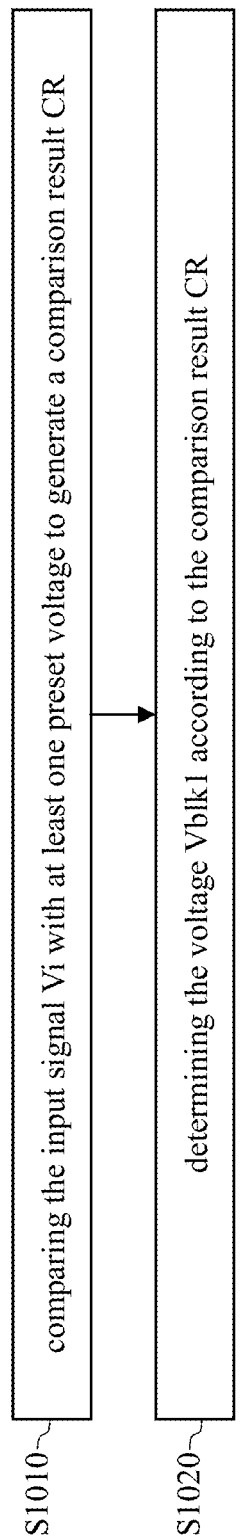
FIG. 10 is a flowchart of a compensation method according to another embodiment of the present invention.

Reference is made to FIG. 10, which is a flowchart of a compensation method according to another embodiment of the present invention. FIG. 10 corresponds to the embodiment of FIG. 9 and includes the following steps.

Step S1010: The comparator 924 compares the input signal Vi with at least one preset voltage (Vr1, Vr2, . . . ) to generate a comparison result CR.

Step S1020: The voltage generator 922 determines the voltage Vblk1 according to the comparison result CR.

The voltage generator 922 further performs steps S810 through S820 in FIG. 8.

Figure 11:
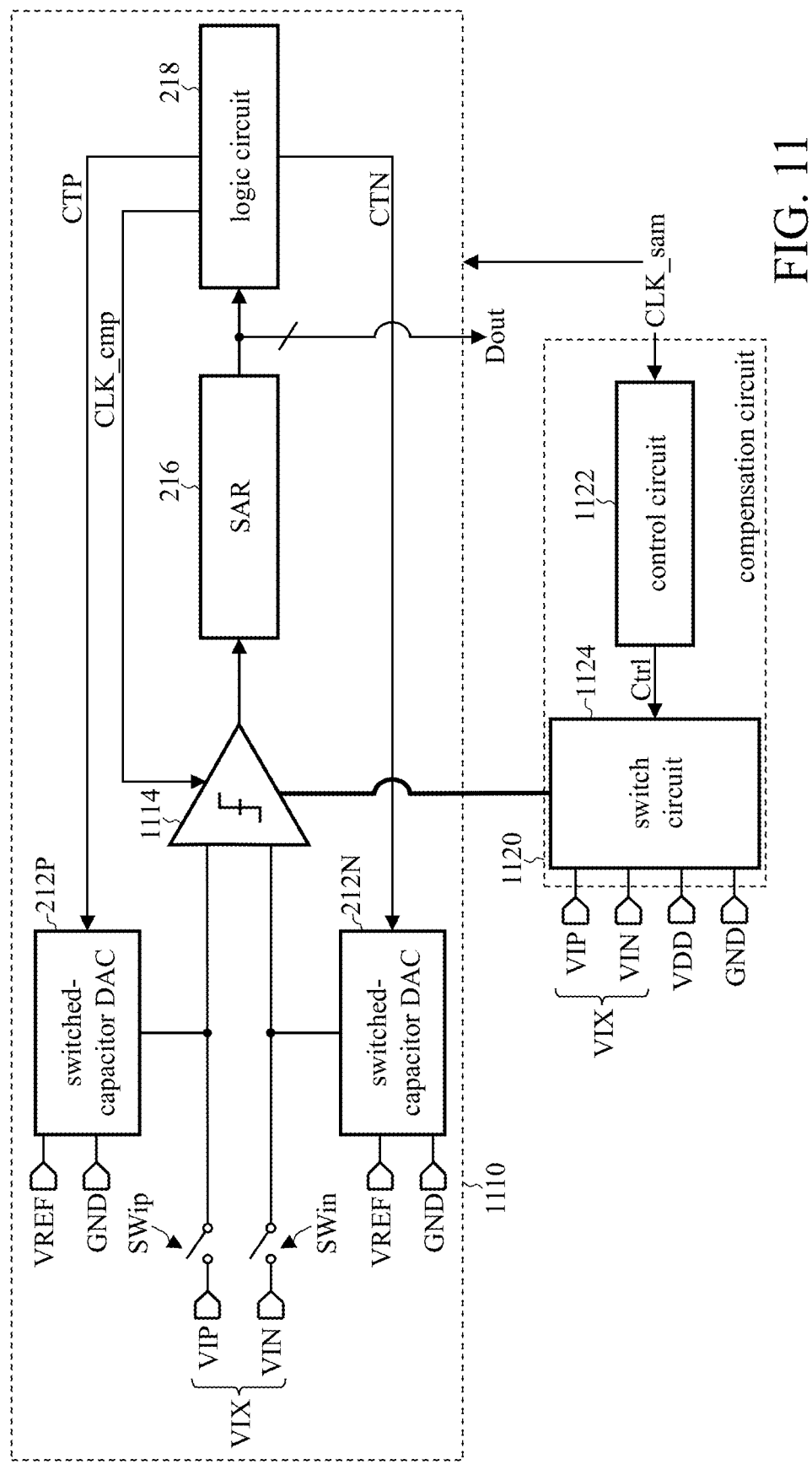
FIG. 11 shows a functional block diagram of a SAR ADC and a compensation circuit according to another embodiment of the present invention.

FIG. 11 shows a functional block diagram of a SAR ADC and a compensation circuit according to another embodiment of the present invention. The compensation circuit 1120 is used to compensate for the nonlinearity of the comparator 1114, thereby enhancing the overall linearity of the SAR ADC 1110. The SAR ADC 1110 is similar to the SAR ADC 210, except that the connection between the comparator 1114 and the compensation circuit 1120 is different from the connection between the comparator 214 and the compensation circuit 220. That is, the compensation circuit 1120 provides another compensation mechanism which is detailed below.

The compensation circuit 1120 includes a control circuit 1122 and a switch circuit 1124. The control circuit 1122 controls the switch circuit 1124 with the control signal Ctrl according to the sampling clock CLK_sam. The switch circuit 1124 provides the input signal VIP, the input signal VIN, the reference voltage VDD (e.g., power supply voltage) and/or the reference voltage GND to the nodes of the comparator 1114 according to the control signal Ctrl. Similarly, the compensation circuit 1120 compensates the SAR ADC 1110 according to equation (1). FIGS. 12A through 12B, FIGS. 13A through 13B, and FIGS. 14A through 14B, corresponding respectively to the parasitic capacitances Cgb(Vi), Cgd(Vi), and Cgs(Vi) of the comparator 1114, illustrate the compensation mechanism for the linearity of the SAR ADC 1110.

Figure 12A:
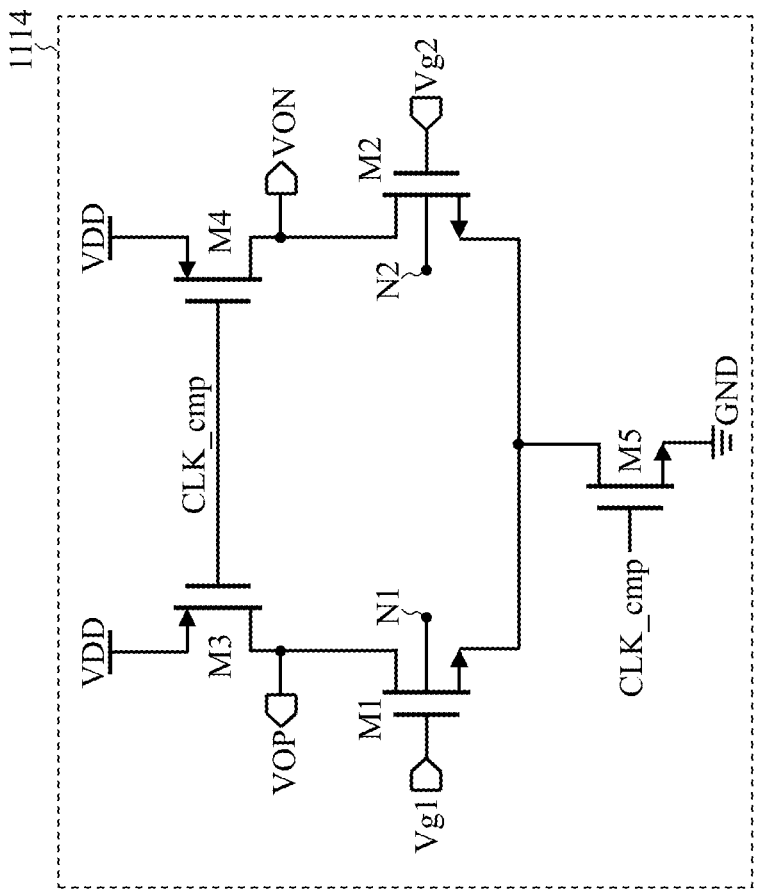
FIG. 12A is a circuit diagram of a comparator and a switch circuit according to an embodiment of the present invention.
Figure 12A:
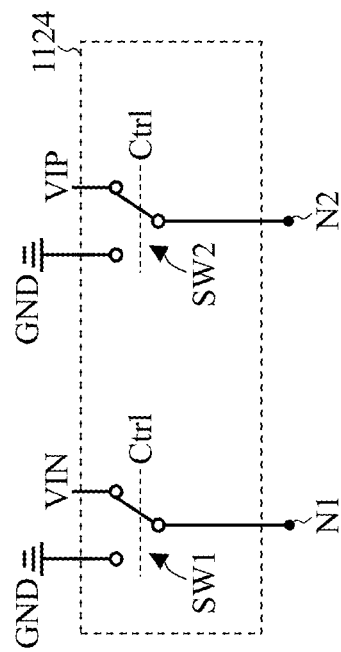

Reference is made to FIG. 12A, which is a circuit diagram of the comparator 1114 and the switch circuit 1124 according to an embodiment of the present invention (performing (linearity) compensation with respect to the parasitic capacitance Cgb(Vi)). The switch circuit 1124 includes a switch SW1 and a switch SW2. The comparator 1114 is similar to the comparator 214, except that the bulk of the transistor M1 (namely, the node N1) is coupled to (receives) the input signal VIN or the reference voltage GND through the switch SW1, and the bulk of the transistor M2 (namely, the node N2) is coupled to (receives) the input signal VIP or the reference voltage GND through the switch SW2.

More specifically, during the sampling phase Φs (where Vg1=VIN and Vg2=VIP), the control circuit 1122 controls the switch SW1 and the switch SW2 to couple to (receive) the input signal VIN and the input signal VIP respectively. In this way, during the sampling phase Φs, the gate and the bulk of the transistor M1 are both coupled or electrically connected to the input signal VIN, and the gate and the bulk of the transistor M2 are both coupled or electrically connected to the input signal VIP, so that the charge amount Qb on the parasitic capacitance Cgb(Vi) (where Qb=Cgb (Vi)× (Vi−Vb)) is substantially 0 (because the bulk voltage Vb is substantially equal to the input signal Vi). Therefore, the linearity of the SAR ADC 1110 can be improved.

Figure 12B:
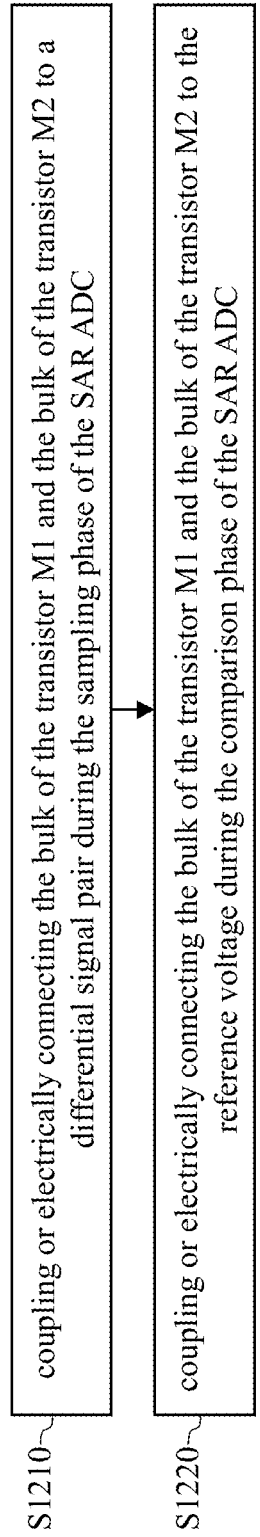
FIG. 12B is a flowchart of a compensation method according to another embodiment of the present invention.

Reference is made to FIG. 12B, which is a flowchart of a compensation method according to another embodiment of the present invention. FIG. 12B corresponds to the embodiment of FIG. 12A and includes the following steps.

Step S1210: During the sampling phase Φs of the SAR ADC 1110, the bulk of the transistor M1 and the bulk of the transistor M2 are coupled or electrically connected to a differential signal pair (including the input signal VIP and the input signal VIN), so that the gate voltage of the transistor M1 is substantially equal to the bulk voltage of the transistor M1, and the gate voltage of the transistor M2 is substantially equal to the bulk voltage of the transistor M2.

Step S1220: During the comparison phase Pc of the SAR ADC 1110, the bulk of the transistor M1 and the bulk of the transistor M2 are coupled or electrically connected to the reference voltage GND (e.g., ground level).

Figure 13A:
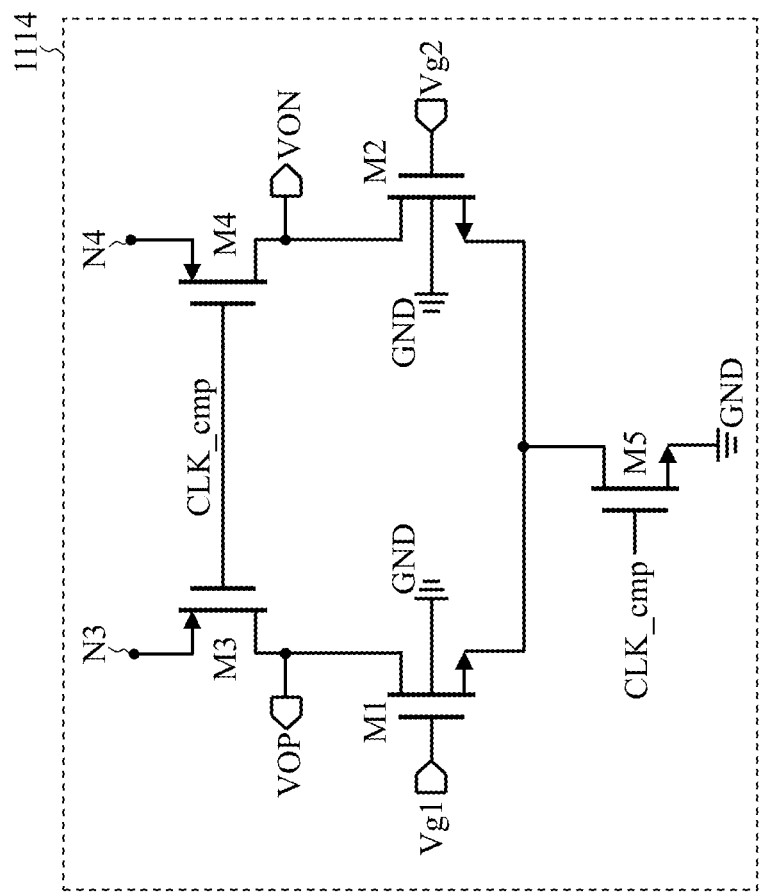
FIG. 13A is a circuit diagram of a comparator and a switch circuit according to another embodiment of the present invention.
Figure 13A:
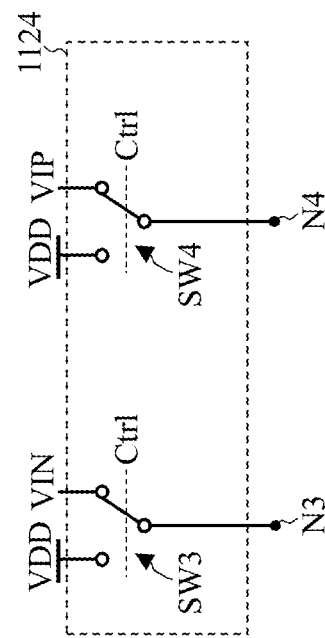

Reference is made to FIG. 13A, which is a circuit diagram of the comparator 1114 and the switch circuit 1124 according to another embodiment of the present invention (performing (linearity) compensation with respect to the parasitic capacitance Cgd (Vi)). The switch circuit 1124 includes a switch SW3 and a switch SW4. The comparator 1114 is similar to the comparator 214, except that the source of the transistor M3 (namely, the node N3) is coupled to (receives) the input signal VIN or the reference voltage VDD through the switch SW3, and the source of the transistor M4 (namely, the node N4) is coupled to (receives) the input signal VIP or the reference voltage VDD through the switch SW4.

More specifically, during the sampling phase Φs (where Vg1=VIN, Vg2=VIP, and the clock CLK_cmp is at the low level (i.e., the transistor M3 and the transistor M4 are turned on)), the control circuit 1122 controls the switch SW3 and the switch SW4 to couple to (receive) the input signal VIN and the input signal VIP respectively. In this way, during the sampling phase Φs, the gate and drain of the transistor M1 are both coupled or electrically connected to the input signal VIN, and the gate and drain of the transistor M2 are both coupled or electrically connected to the input signal VIP, so that the charge amount Qd on the parasitic capacitance Cgd(Vi) (where Qd=Cgd(Vi)×(Vi−Vd)) is substantially 0 (because the drain voltage Vd is substantially equal to the input signal Vi). Therefore, the linearity of the SAR ADC 1110 can be improved.

Figure 13B:
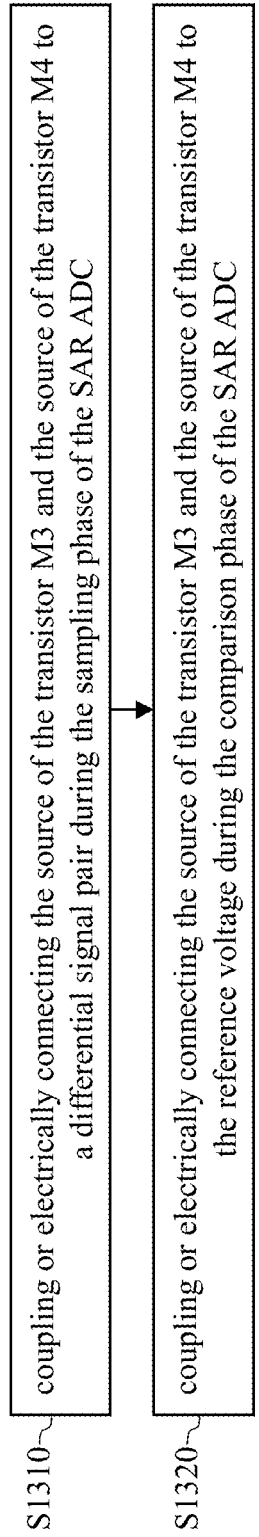
FIG. 13B is a flowchart of a compensation method according to another embodiment of the present invention.

Reference is made to FIG. 13B, which is a flowchart of a compensation method according to another embodiment of the present invention. FIG. 13B corresponds to the embodiment of FIG. 13A and includes the following steps.

Step S1310: During the sampling phase Φs of the SAR ADC 1110, the source of the transistor M3 and the source of the transistor M4 are coupled or electrically connected to a differential signal pair (including the input signal VIP or the input signal VIN), so that the gate voltage of the transistor M1 is equal to the drain voltage of the transistor M1, and the gate voltage of the transistor M2 is equal to the drain voltage of the transistor M2.

Step S1320: During the comparison phase Pc of the SAR ADC 1110, the source of the transistor M3 and the source of the transistor M4 are coupled or electrically connected to the reference voltage VDD (e.g., the power supply voltage).

Figure 14A:
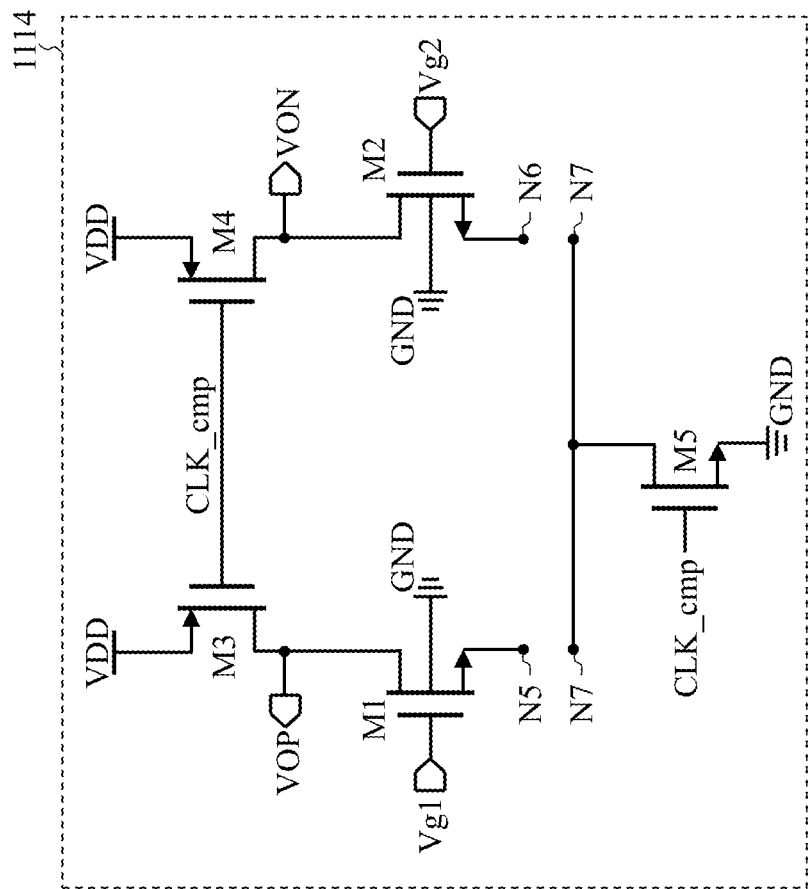
FIG. 14A is a circuit diagram of a comparator and a switch circuit according to another embodiment of the present invention.
Figure 14A:
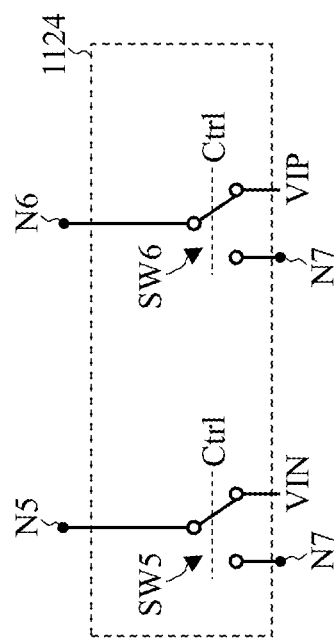

Reference is made to FIG. 14A, which is a circuit diagram of the comparator 1114 and the switch circuit 1124 according to another embodiment of the present invention (performing (linearity) compensation with respect to the parasitic capacitance Cgs(Vi)). The switch circuit 1124 includes a switch SW5 and a switch SW6. The comparator 1114 is similar to the comparator 214, except that the source of the transistor M1 (namely, the node N5) is coupled to the drain of the transistor M5 (namely, the node N7) or coupled to (receives) the input signal VIN through the switch SW5, and the source of the transistor M2 (namely, the node N6) is coupled to the drain of the transistor M5 or coupled to (receives) the input signal VIP through the switch SW6.

More specifically, during the sampling phase Φs (where Vg1=VIN and Vg2=VIP), the control circuit 1122 controls the switch SW5 and the switch SW6 to couple to (receive) the input signal VIN and the input signal VIP respectively. In this way, during the sampling phase Φs, the gate and source of the transistor M1 are both coupled or electrically connected to the input signal VIN, and the gate and source of the transistor M2 are both coupled or electrically connected to the input signal VIP, so that the charge amount Qs on the parasitic capacitance Cgs (Vi) (where Qs=Cgs(Vi)×(Vi−Vs)) is substantially 0 (because the source voltage Vs is substantially equal to the input signal Vi). Therefore, the linearity of the SAR ADC 1110 can be improved.

Figure 14B:
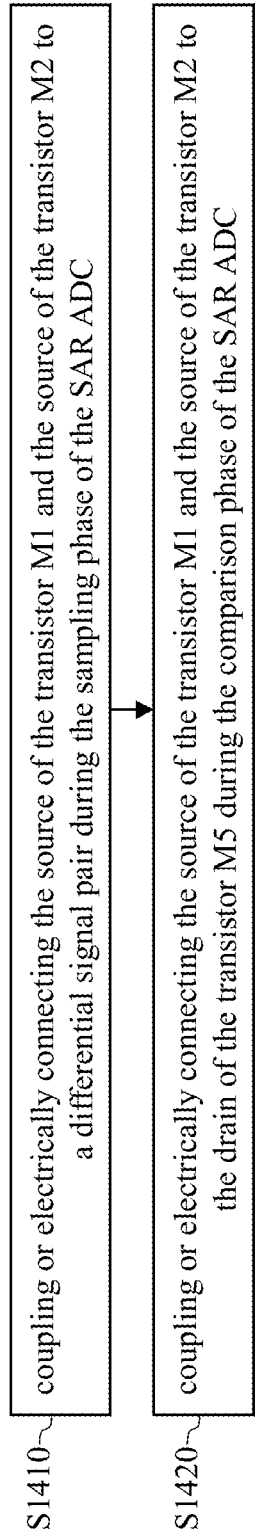
FIG. 14B is a flowchart of a compensation method according to another embodiment of the present invention.

Reference is made to FIG. 14B, which is a flowchart of a compensation method according to another embodiment of the present invention. FIG. 14B corresponds to the embodiment of FIG. 14A and includes the following steps.

Step S1410: During the sampling phase Φs of the SAR ADC 1110, the source of the transistor M1 and the source of the transistor M2 are coupled or electrically connected to a differential signal pair (including the input signal VIP or the input signal VIN), so that the gate voltage of the transistor M1 is equal to the source voltage of the transistor M1, and the gate voltage of the transistor M2 is equal to the source voltage of the transistor M2.

Step S1420: During the comparison phase Pc of the SAR ADC 1110, the source of the transistor M1 and the source of the transistor M2 are coupled or electrically connected to the drain of the transistor M5.

Figure 15:
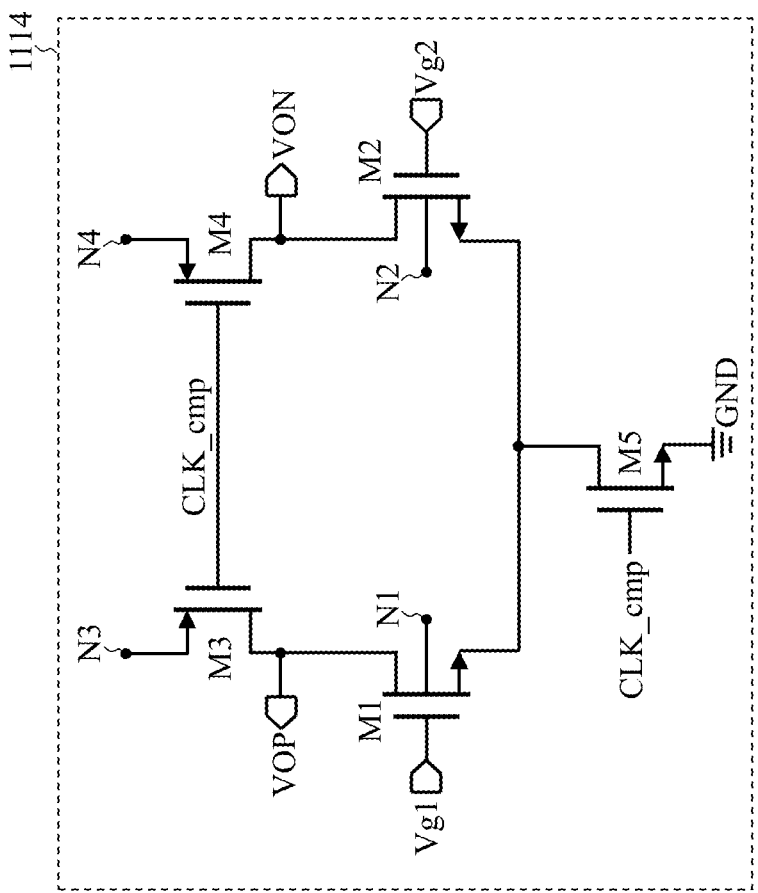
FIG. 15 is a circuit diagram of a comparator and a switch circuit according to another embodiment of the present invention.
Figure 15:
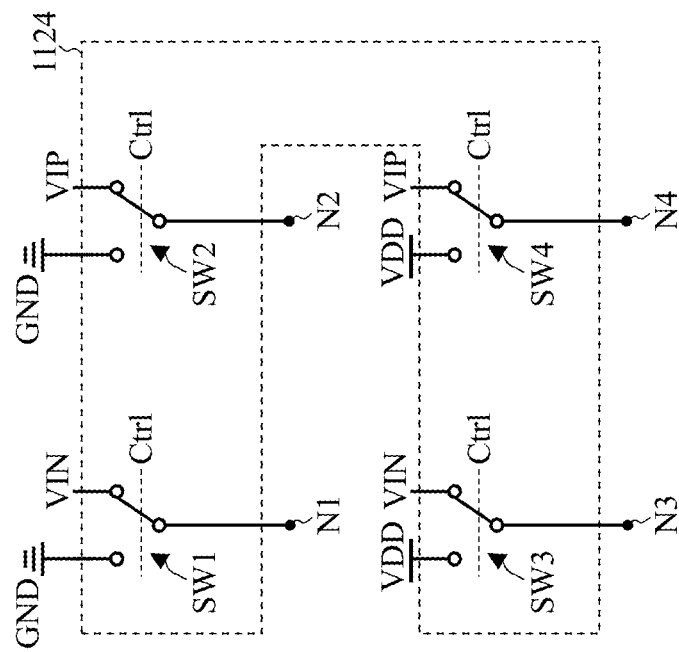

Reference is made to FIG. 15, which is a circuit diagram of the comparator 1114 and the switch circuit 1124 according to another embodiment of the present invention (performing (linearity) compensation with respect to the parasitic capacitance Cgb(Vi) and the parasitic capacitance Cgd (Vi)). More specifically, the embodiment of FIG. 15 is a combination of the embodiments of FIGS. 12A and 13A. In comparison with the embodiments of FIG. 12A, FIG. 13A, and FIG. 14A, the embodiment of FIG. 15 can further improve the linearity of the SAR ADC 1110.

Similarly, people having ordinary skill in the art can combine the embodiments of FIGS. 12A and 14A or the embodiments of FIGS. 13A and 14A according to the above discussion.

Figure 16:
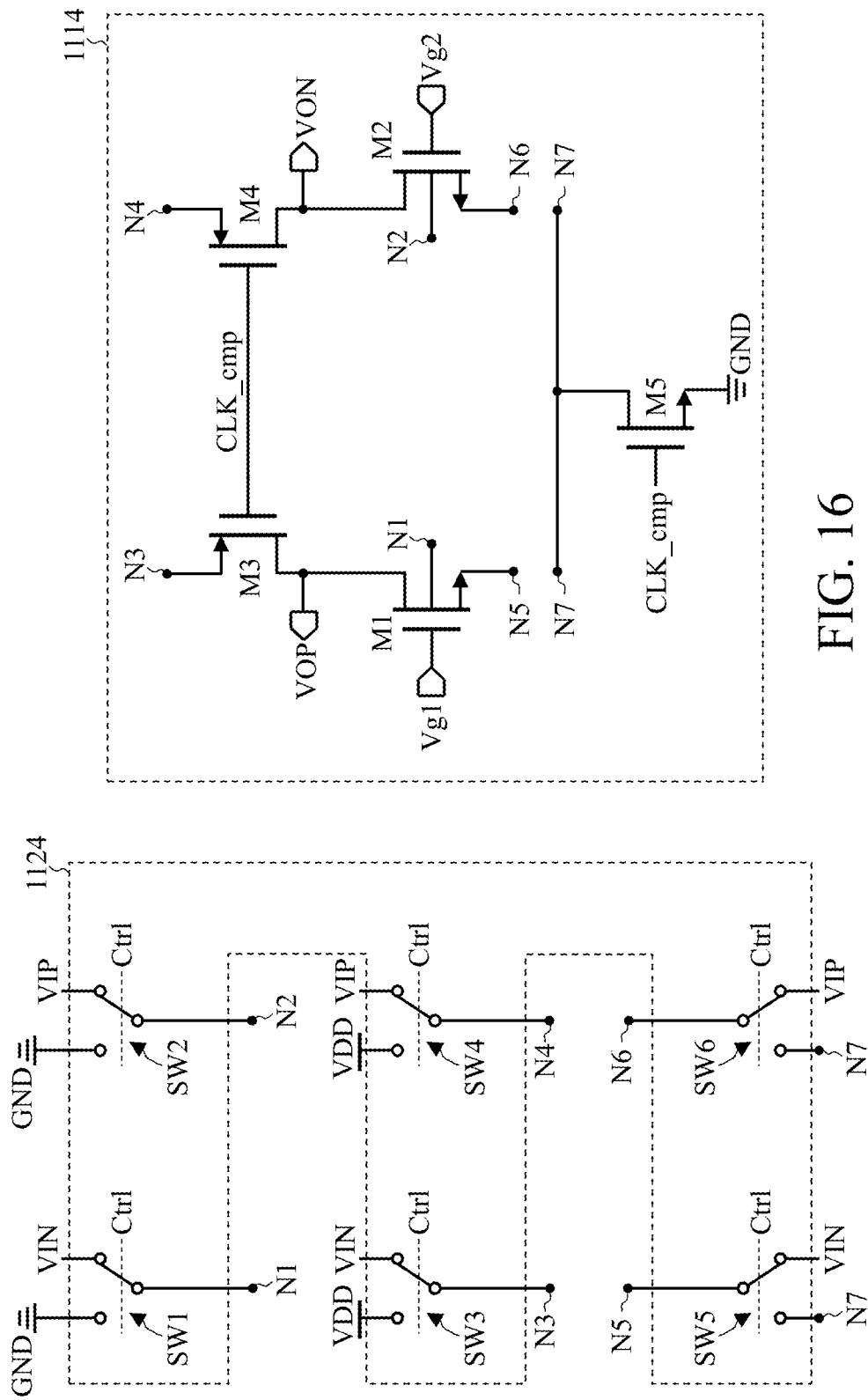
FIG. 16 is a circuit diagram of the comparator 114 and a switch circuit according to another embodiment of the present invention.

Reference is made to FIG. 16, which is a circuit diagram of the comparator 1114 and the switch circuit 1124 according to another embodiment of the present invention (performing (linearity) compensation with respect to the parasitic capacitance Cgb(Vi), the parasitic capacitance Cgd(Vi), and the parasitic capacitance Cgs(Vi)). More specifically, the embodiment of FIG. 16 is a combination of the embodiments of FIGS. 12A, 13A, and 14A. In comparison with the embodiment of FIG. 15, the embodiment of FIG. 16 can further improve the linearity of the SAR ADC 1110.

The compensation circuit of the present invention can be implemented in the SAR ADC itself and any circuit or device containing the SAR ADC, such as a pipeline SAR ADC.

The SAR ADCs are intended to illustrate the invention by way of example and not to limit the scope of the claimed invention. People having ordinary skill in the art may apply the present invention to other types of circuits or devices in accordance with the foregoing discussions.

Since a person having ordinary skill in the art can appreciate the implementation detail and the modification thereto of the present method invention through the disclosure of the device invention, repeated and redundant description is thus omitted. Note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A compensation circuit applied to a successive-approximation register (SAR) analog-to-digital converter (ADC) that comprises a comparator including a first transistor and a second transistor, wherein the first transistor and the second transistor receive an input signal during a sampling phase, and the comparator determines at least one bit of a digital output code during a comparison phase, the compensation circuit comprising:
   a voltage generator coupled to the comparator and configured to provide a first voltage to a first bulk of the first transistor and a second bulk of the second transistor during the sampling phase and provide a second voltage to the first bulk of the first transistor and the second bulk of the second transistor during the comparison phase.

2. The compensation circuit of claim 1, wherein the first voltage is greater than the second voltage.

3. The compensation circuit of claim 2, wherein the second voltage is a ground level.

4. The compensation circuit of claim 1, wherein the input signal comprises a first input signal and a second input signal, and during the sampling phase, a first gate of the first transistor receives the first input signal, and a second gate of the second transistor receives the second input signal.

5. The compensation circuit of claim 1, wherein the comparator is a first comparator, the input signal comprises a first input signal and a second input signal, the compensation circuit further comprises:
   a second comparator coupled to the voltage generator and configured to compare one of the first input signal and the second input signal with at least one preset voltage to generate a comparison result;
   wherein the voltage generator determines the first voltage according to the comparison result.

6. A compensation method applied to a successive-approximation register (SAR) analog-to-digital converter (ADC) that comprises a comparator including a first transistor and a second transistor, wherein the first transistor and the second transistor receive an input signal during a sampling phase, and the comparator determines at least one bit of a digital output code during a comparison phase, the compensation method comprising:
   providing a first voltage to a first bulk of the first transistor and a second bulk of the second transistor during the sampling phase; and
   providing a second voltage to the first bulk of the first transistor and the second bulk of the second transistor during the comparison phase.

7. The compensation method of claim 6, wherein the first voltage is greater than the second voltage.

8. The compensation method of claim 7, wherein the second voltage is a ground level.

9. The compensation method of claim 6, wherein the input signal comprises a first input signal and a second input signal, and during the sampling phase, a first gate of the first transistor receives the first input signal, and a second gate of the second transistor receives the second input signal.

10. The compensation method of claim 6, wherein the input signal comprises a first input signal and a second input signal, the compensation method further comprises:
   comparing one of the first input signal and the second input signal with at least one preset voltage to generate a comparison result; and
   determining the first voltage according to the comparison result.

11. A compensation circuit applied to a successive-approximation register (SAR) analog-to-digital converter (ADC) that comprises a comparator including a first transistor, a second transistor, a third transistor, a fourth transistor, and a fifth transistor, wherein a first drain of the first transistor is electrically connected to a third drain of the third transistor, a second drain of the second transistor is electrically connected to a fourth drain of the fourth transistor, the first transistor and the second transistor receive an input signal during a sampling phase, and the comparator determines at least one bit of a digital output code during a comparison phase, the compensation circuit comprising:
   a first switch coupled to a first node, the first node being one of a first bulk of the first transistor, a third source of the third transistor, and a first source of the first transistor; and
   a second switch coupled to a second node, the second node being one of a second bulk of the second transistor, a fourth source of the fourth transistor, and a second source of the second transistor;
   wherein during the sampling phase, the first switch and the second switch couple the first node and the second node to the input signal; and
   wherein during the comparison phase, the first switch and the second switch couple the first node and the second node to a reference voltage or a fifth drain of the fifth transistor.

12. The compensation circuit of claim 11, wherein the first node is the first bulk of the first transistor, the second node is the second bulk of the second transistor, and during the comparison phase, the first switch and the second switch couple the first node and the second node to the reference voltage, and the reference voltage is a ground level.

13. The compensation circuit of claim 12 further comprising:
   a third switch coupled to the third source of the third transistor; and
   a fourth switch coupled to the fourth source of the fourth transistor;
   wherein during the sampling phase, the third switch and the fourth switch couple the third source of the third transistor and the fourth source of the fourth transistor to the input signal; and
   wherein during the comparison phase, the third switch and the fourth switch couple the third source of the third transistor and the fourth source of the fourth transistor to a power supply voltage.

14. The compensation circuit of claim 13 further comprising:
   a fifth switch coupled to the first source of the first transistor; and
   a sixth switch coupled to the second source of the second transistor;
   wherein during the sampling phase, the fifth switch and the sixth switch couple the first source of the first transistor and the second source of the second transistor to the input signal; and
   wherein during the comparison phase, the fifth switch and the sixth switch couple the first source of the first transistor and the second source of the second transistor to the fifth drain of the fifth transistor.

15. The compensation circuit of claim 12 further comprising:
   a third switch coupled to the first source of the first transistor; and
   a fourth switch coupled to the second source of the second transistor;

wherein during the sampling phase, the third switch and the fourth switch couple the first source of the first transistor and the second source of the second transistor to the input signal; and wherein during the comparison phase, the third switch and the fourth switch couple the first source of the first transistor and the second source of the second transistor to the fifth drain of the fifth transistor.

16. The compensation circuit of claim 11, wherein the first node is the third source of the third transistor, the second node is the fourth source of the fourth transistor, and during the comparison phase, the first switch and the second switch couple the first node and the second node to the reference voltage, and the reference voltage is a power supply voltage.

17. The compensation circuit of claim 16 further comprising:
   a third switch coupled to the first source of the first transistor; and
   a fourth switch coupled to the second source of the second transistor;
   wherein during the sampling phase, the third switch and the fourth switch couple the first source of the first transistor and the second source of the second transistor to the input signal; and
   wherein during the comparison phase, the third switch and the fourth switch couple the first source of the first transistor and the second source of the second transistor to the fifth drain of the fifth transistor.

18. The compensation circuit of claim 11, wherein the first node is the first source of the first transistor, the second node is the second source of the second transistor, and during the comparison phase, the first switch and the second switch couple the first node and the second node to the fifth drain of the fifth transistor.

* * * * *